(12) United States Patent  
Martirosyan et al.

(10) Patent No.: US 10,789,398 B2  
(45) Date of Patent: Sep. 29, 2020

(54) METHOD AND APPARATUS FOR SOC WITH OPTIMAL RSMA

(71) Applicant: Synopsys, Inc., Mountain View, CA (US)

(72) Inventors: Suren Martirosyan, Yerevan (AM); Gurgen Harutyunyan, Yerevan (AM); Samvel Shoukourian, Yerevan (AM); Yervant Zorian, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 221 days.

(21) Appl. No.: 15/684,780

(22) Filed: Aug. 23, 2017

(65) Prior Publication Data  
US 2018/0129769 A1    May 10, 2018

Related U.S. Application Data

(60) Provisional application No. 62/382,099, filed on Aug. 31, 2016, provisional application No. 62/382,656, filed on Sep. 1, 2016.

(51) Int. Cl.
| | |
|---|---|
| *G06F 30/00* | (2020.01) |
| *G06F 30/30* | (2020.01) |
| *G11C 29/44* | (2006.01) |
| *G11C 29/00* | (2006.01) |

(52) U.S. Cl.  
CPC .......... *G06F 30/30* (2020.01); *G11C 29/4401* (2013.01); *G11C 29/72* (2013.01); *G11C 29/814* (2013.01); *G11C 29/835* (2013.01)

(58) Field of Classification Search  
CPC .................................................. G06F 17/5045  
USPC .......................................................... 716/132  
See application file for complete search history.

(56) References Cited

U.S. PATENT DOCUMENTS

| | | | |
|---|---|---|---|
| 6,745,370 B1* | 6/2004 | Segal ...................... | G11C 29/72 257/E21.526 |
| 6,829,736 B1* | 12/2004 | Marinissen ............ | G11C 29/44 714/711 |
| 7,093,156 B1* | 8/2006 | Shubat ............... | G11C 29/4401 365/200 |
| 7,127,647 B1* | 10/2006 | Zorian .................... | G11C 29/16 714/711 |
| 7,149,921 B1 | 12/2006 | Zorian et al. | |
| 7,237,154 B1* | 6/2007 | Zorian ............. | G11C 29/56008 714/711 |
| 7,290,186 B1* | 10/2007 | Zorian ............. | G11C 29/12015 714/718 |
| 7,415,640 B1* | 8/2008 | Zorian ................... | G11C 29/44 365/200 |
| 2008/0008015 A1* | 1/2008 | Darbinyan ........... | G11C 29/802 365/200 |
| 2016/0172058 A1* | 6/2016 | Srivastava ........... | G11C 29/802 714/6.31 |

* cited by examiner

*Primary Examiner* — Suchin Parihar  
(74) *Attorney, Agent, or Firm* — Jaquez Land Greenhaus LLP; Bruce W. Greenhaus, Esq.

(57) ABSTRACT

A method for determining redundancy usage rate from a group of memory parameters and a memory yield of a System on a Chip (SoC), using the probabilistic redundancy usage rate and using that rate to calculate an optimal RSMA size. An SoC is then fabricated with the optimal RSMA size.

4 Claims, 9 Drawing Sheets

METHOD AND APPARATUS FOR SOC WITH OPTIMAL RSMA

The present application claims priority to U.S. Provisional Application No. 62/382,099, filed on Aug. 31, 2016, entitled "Calculation of Optimal Size of E-Fuse Used in Memory Repair Flow", which is herein incorporated by reference in its entirety. The present application also claims priority to U.S. Provisional Application No. 62/382,656 filed on Sep. 1, 2016, entitled "Calculation of Optimal Size of E-Fuse Used in Memory Repair Flow", which is herein incorporated by reference in its entirety.

BACKGROUND

FIG. 1 illustrates a configuration of a System-on-a-Chip (SoC) 100 having a plurality of modules 101, 102. In some such SoCs, at least one of the modules 101 includes a server 103 and one or more Repair Signature Memory Areas (RSMAs) 106. Other modules 102 comprise a Built-in-Self-Test unit (BIST) 105 and one or more embedded memories 104. In the example shown in FIG. 1, a first module 102a has four memories 104. Other modules 102 have either one or two memories 104. The server 103 works together with the RSMAs 106 within the module 101 and the BIST 105 in each module 102 to detect and repair faults in the memories 104 of the modules 102. Each of the BISTs 105 is connected to the server 103. The server 103 provides centralized test access and can schedule tests of the memories 104 to be performed by the BISTs 105. The BISTs 105 perform the tests on the memories 104 to which they are connected. The results of these tests indicate whether there are any faults within the memories 104.

FIG. 2 is an illustration of one such embedded memory 104. The embedded memory 104 may have a memory main array 202 having several memory elements 201 organized into rows 205 and columns 207. In addition, the memory 104 has redundant elements 204 that are also organized into rows and columns. Currently, it is a common practice to group redundant elements 204 together to form Column Redundancy Groups 206 or Row Redundancy Groups 302 (see FIG. 3). This grouping makes infrastructure used for design and test more effective. FIG. 2 is an illustration of a memory 104 in which two columns of redundant elements 204 are grouped together in each Column Redundancy Group 206. FIG. 3 is an illustration of a memory 104 in which two rows of redundant elements 204 of are grouped together in each Row Redundancy Group 302.

The testing performed by the BIST 105 results in sets of information (commonly referred to as "repair signatures") that indicate a row and/or column of a memory element 201 that is faulty. The BIST 105 returns the repair signatures to the server 103. The server 103 stores the repair signatures in one of the RSMAs 106. The repair signatures can then be used in a repair phase during which a repair engine 107 within the server 103 substitutes a Row Redundancy Group 302 or Column Redundancy Group 206 for one or more rows 205 or columns 207 that have faulty memory elements 201, as indicated by the repair signatures stored in the RSMAs 106. The redundant elements 204 can be substituted for faulty memory elements 201 within the memory main array 202 in order to repair faults within the memory main array 202 under the control of the repair engine 107.

FIG. 4 is an illustration of a memory main array 202 with a failed memory element 401 (shown with a solid X) in the second row of the third column within the memory main array 202. The redundant elements 204 of FIG. 4 are grouped in Column Redundancy Groups 206, 405. In some such Redundancy Groups, the redundant elements 204 are inseparable. This means that if a fault is detected in a memory element 401, a repair is performed by substituting an entire redundancy group for the failed memory element 401 and those operational memory elements that are nearby. For example, to repair the failed memory element 401 in Column 3 of the memory main array 202, a repair is performed by substituting the entire first Redundancy Group 206 for the third and fourth column 407 of the memory main array 202. That is, the two consecutive columns of memory elements 407 shown with dashed Xs, including the failed memory element 401 are replaced by the first Redundancy Group 206.

Likewise, if there is an additional fault in a memory element 409 of Column 7 or Column 8, the fault is repaired by substituting the second Column Redundancy Group 405 for all of the elements in Column 7 and 8 of the main array 202. Accordingly, since repairs are made using an entire Redundancy Group, it is not possible to use the first redundant column from the first Column Redundancy Group 206 to repair Column 3 while leaving the Column 4 intact, since each of two Column Redundancy Groups 206, 405 shown is two columns wide and can only substitute for main memory as a unit. Additionally, two faulty columns that are not adjacent to each other cannot be repaired by one Column Redundancy Group (e.g., Column 1 cannot be repaired by first redundant column of first Column Redundancy Group, while Column 7 is repaired by second redundant column of the first Column Redundancy Group). The same considerations are applied to the Row Redundancy Groups 302 of FIG. 3. Each memory 104 can contain any number of Column/Row Redundancy Groups, while each Column/Row Redundancy Group can contain any number of redundant columns/rows. However, it is common for each Redundancy Group 206, 405 to have the same number of columns/rows as each other such Redundancy Group 206, 405.

During the repair phase, the repair engine 107 reads the repair signatures from one or more of the RSMAs 106 and substitutes redundant rows and columns from the redundant memory groups 302, 405 for the faulty rows and columns indicated by the repair signatures. For each repair, a predetermined number of bits must be stored in the RSMA 106 to locate the row and column of the faulty memory element 401, 409. Therefore, if all of the redundancy groups are used to make repairs (i.e., a usage rate of 100%), then the RSMA must be large enough to store the number of bits required for one repair times the number of redundancy groups. It should be noted that several faulty memory elements 201 can be repaired in one repair operation. That is, since the repair operation will cause an entire Redundancy Group to be substituted into the memory 104, several faulty elements 201 can lie within the same group of memory elements 201 for which the Redundancy Group is substituted. Accordingly, there need only be one repair signature for each repair, no matter how many faulty memory elements 201 are being substituted during that repair.

The "usage rate" is a measure of the relative number of redundant elements 204 that will be needed over the life of the SoC as a percentage of the total number of memory elements 201 present in the SoC 100. For example, if there are 500 Redundancy Groups present in the SoC 100, a usage rate of 20% would mean that 100 Redundancy Groups are used to make repairs to the main memory array of the SoC. There is typically a low probability that all redundancy groups (usage rate of 100%) will be used in the repair phase. Therefore, since the size of the RSMA 106 determines the total area required for the SoC 100, a conventional approach is to reduce the size of RSMA 106 by determining an approximate "usage rate". The approximate usage rate is then used to determine an appropriate size for the RSMA. For example, if there are 500 redundant elements present in the SoC, a usage rate of 20% would mean that 100 redundant elements will be used to make repairs to the main memory array of the SoC. If each repair requires 10 bits to be stored in the RSMA 106, then for an approximate usage rate of 20%, the RSMA 106 would need to be large enough to store a total of 10 bits times 100 repairs, totaling 1000 bits.

A drawback of this approach is that it is difficult to calculate an accurate usage rate for the Redundancy Groups. Therefore, such an approach results in a sub-optimal RSMA size (i.e., either too large or too small). If the RSMA is larger than needed, the result is more area in the SoC than is ideally required. Conversely, if the RSMA is smaller than needed, it will not be able to store enough information to for all of the faults that occur to be repaired. Accordingly, there is a need for a method and apparatus that can more accurately calculate a usage rate and determine an appropriate RSMA size.

SUMMARY

A system is disclosed for designing a System on a Chip (SoC). The disclosed design system uses probabilistic models and formulas to calculate an exact size required for an Repair Signature Memory Area (commonly referred to as an "RSMA") to store sufficient information to correct defects under the most likely defect scenarios. Two formulas, F1 and F2, are disclosed for the purpose of calculating the size of the RSMA. The first formula, F1, calculates a usage rate based on the probability that redundant elements will be needed to correct errors in a memory. The probability is determined using memory parameters (number of words, number of bits per word, number of redundant elements, etc.) and memory yield (based on foundry input or historical data). The second formula, F2, calculates an appropriate size for an RSMA based on the usage rate determined by F1.

The design system provides an approach that results in an SoC having an area and a repair efficiency that is optimized based on the calculated rate at which redundant elements are likely to be used. Accordingly, the trade-off between the cost of manufacturing SoCs and the ability of the SoC to perform repairs is balanced for SoCs designed using this approach. The details of one or more embodiments of the disclosed method and apparatus are set forth in the accompanying drawings and the description below.

BRIEF DESCRIPTION OF DRAWINGS

The disclosed method and apparatus, in accordance with one or more various embodiments, is described with reference to the following figures. The drawings are provided for purposes of illustration only and merely depict examples of some embodiments of the disclosed method and apparatus. They should not be considered to limit the breadth, scope, or applicability of the claimed invention. For clarity and ease of illustration, these drawings may not be to scale.

In order to easily identify the figure in which a particular element resides, the digit or digits preceding the two least significant digits in a reference number refer to the figure number in which that element is first introduced. For example, module 601, the digit "6" precedes the two least significant digits "01". Therefore, the module 601 first appears in FIG. 6.

It should be understood that the disclosed method and apparatus can be practiced with modification and alteration, and that the invention should be limited only by the claims and the equivalents thereof.

DETAILED DESCRIPTION

Figure 5:
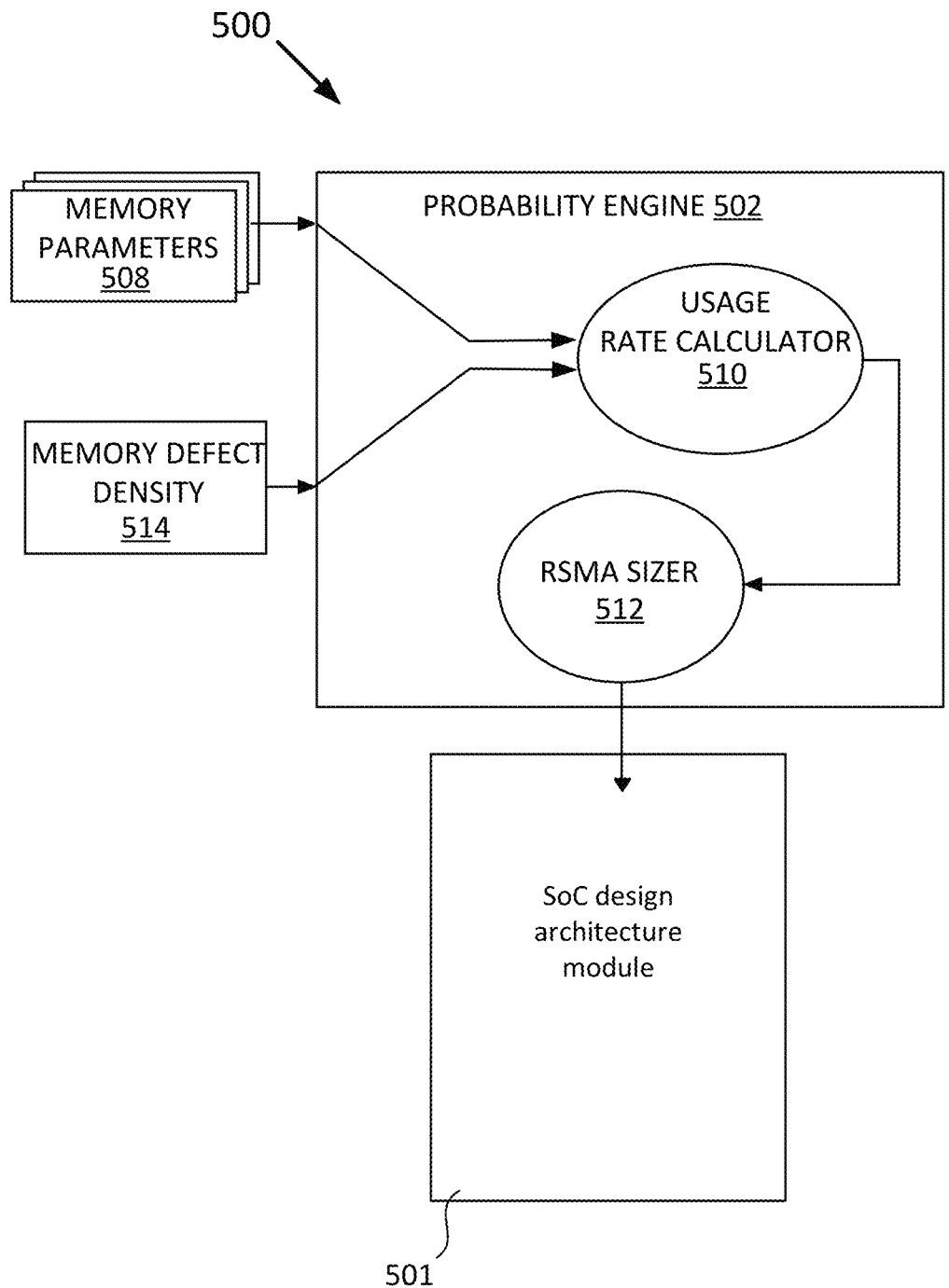
FIG. 5 illustrates a system 500 that can be used to design a System on a Chip (SoC) in accordance with some embodiments of a disclosed method and apparatus.

FIG. 5 illustrates a system 500 that can be used to design a System on a Chip (SoC) in accordance with some embodiments of a disclosed method and apparatus. The system 500 comprises a SoC design architecture module 501, a probability engine 502, a memory parameter source 508, and a memory defect density source 514. The probability engine 502 comprises a usage rate calculator 510, and an RSMA sizer 512. The SoC design architecture module 501 is a module that uses a set of parameters that can be used to fabricate an SoC having desired specifications.

Figure 6:
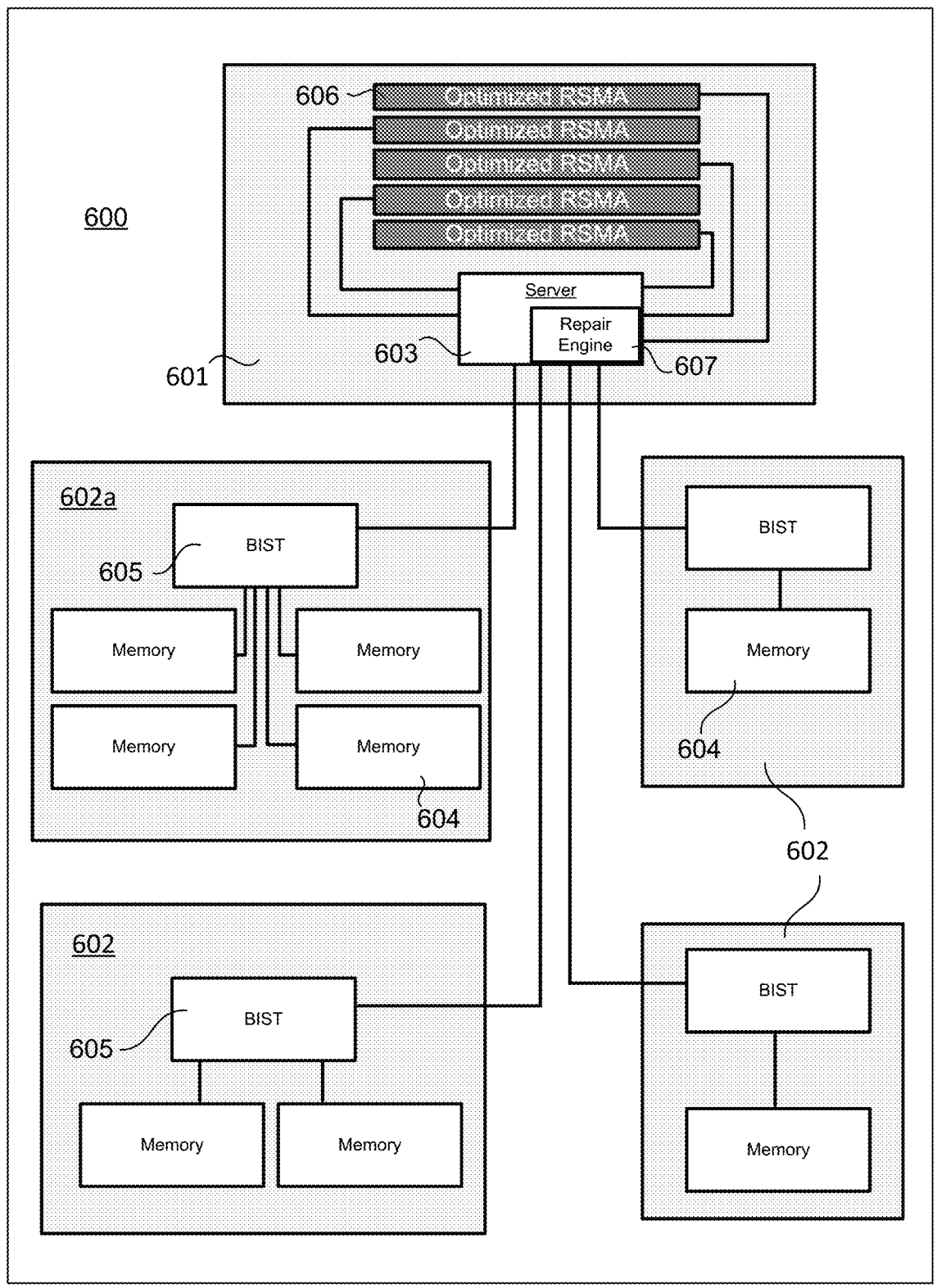
FIG. 6 is a simplified block diagram of an SoC.

FIG. 6 is a simplified block diagram of such an SoC 600. The parameters include the size of optimized RSMAs 606 fabricated in at least one module 601 of the SoC 600 as determined by the RSMA sizer 512 within the probability engine 502. In some embodiments, the RSMA is a section of non-volatile memory. In other embodiments, the RSMA can be located in any type of memory that allows repair signatures to be stored.

Figure 1:
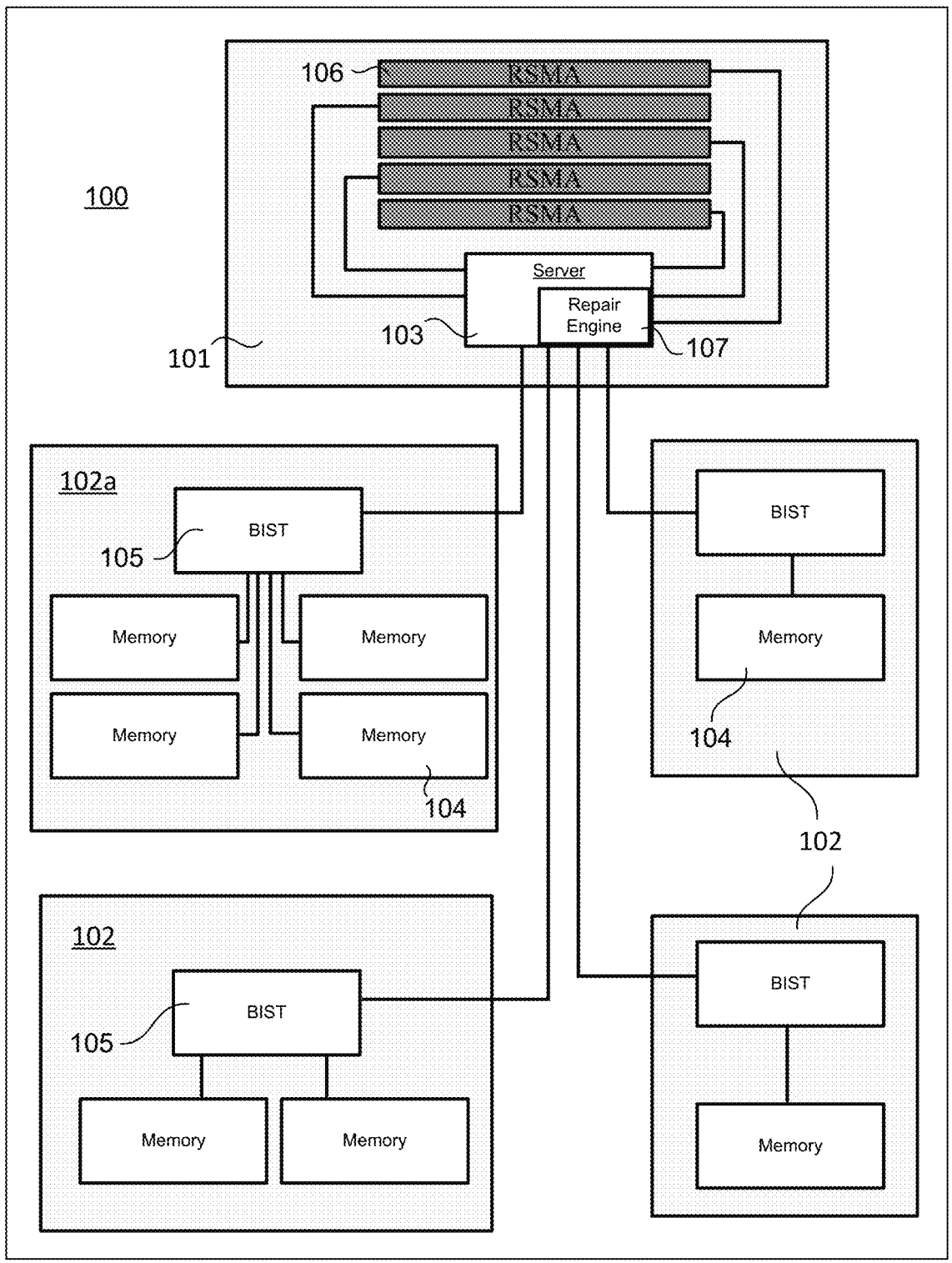
FIG. 1 illustrates a configuration of SoC modules in accordance with one embodiment of the disclosed method and apparatus.
Figure 2:
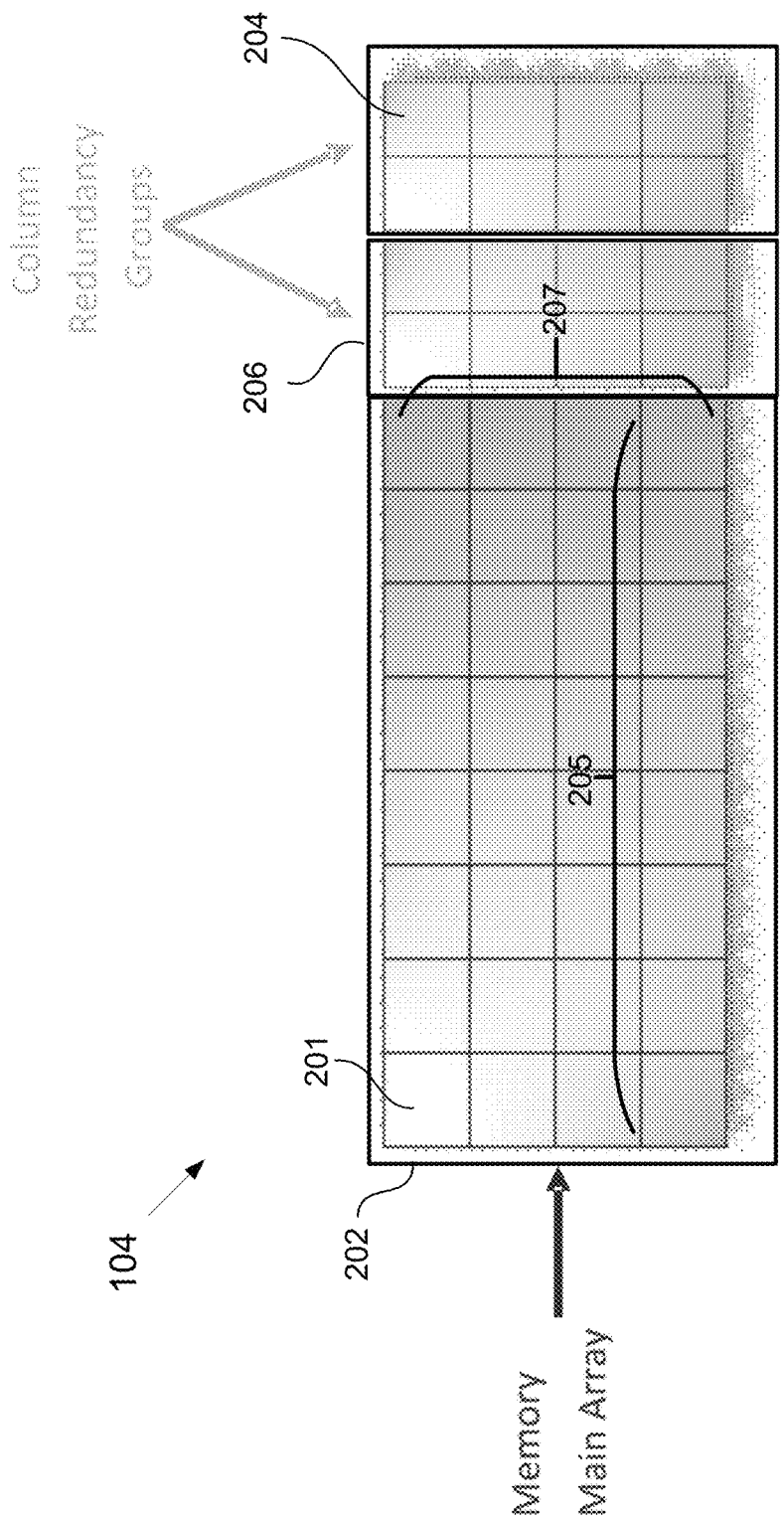
FIG. 2 shows a memory structure with Column Redundant Groups.
Figure 3:
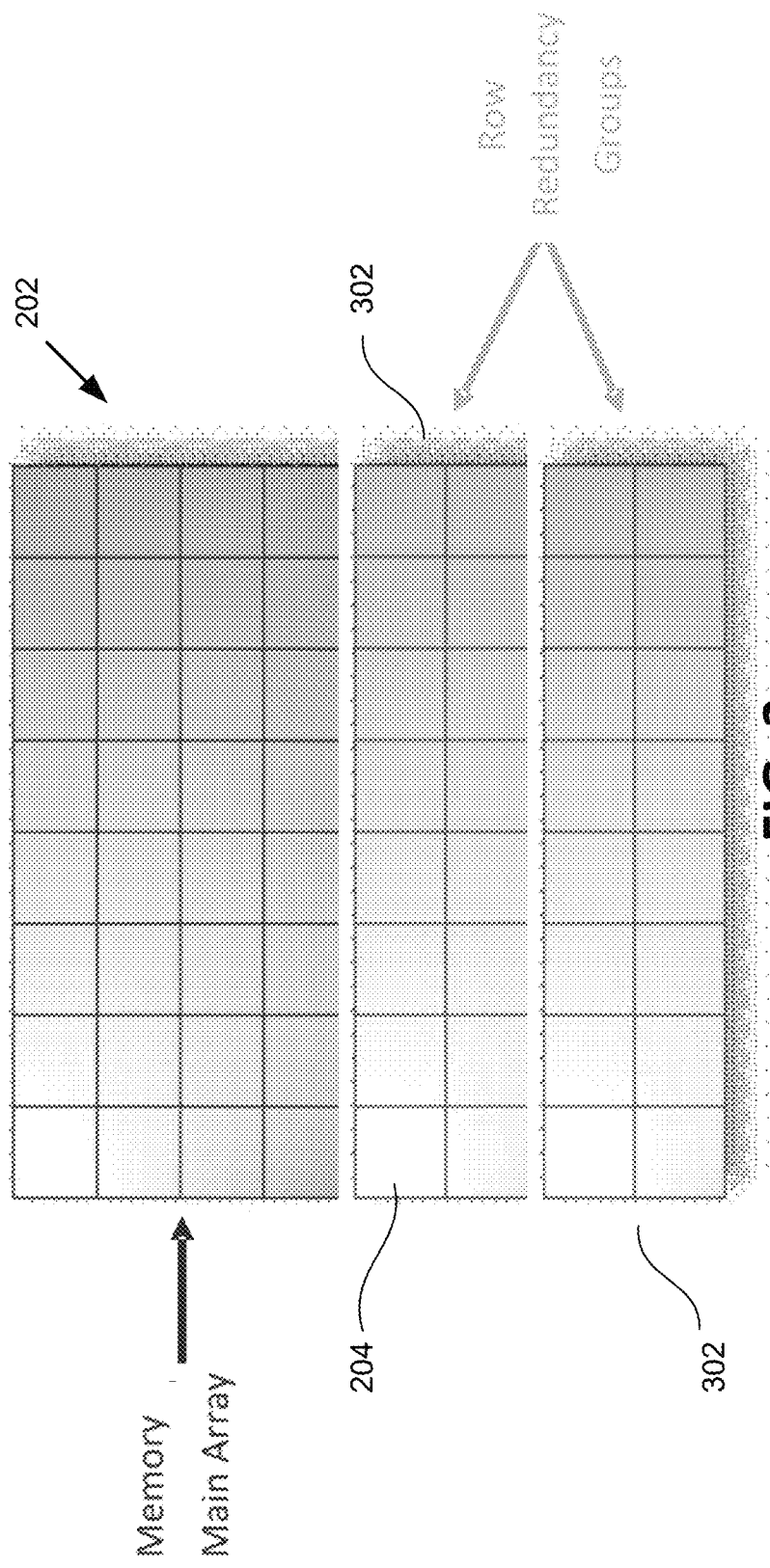
FIG. 3 shows a memory structure with Row Redundant Groups.
Figure 4:
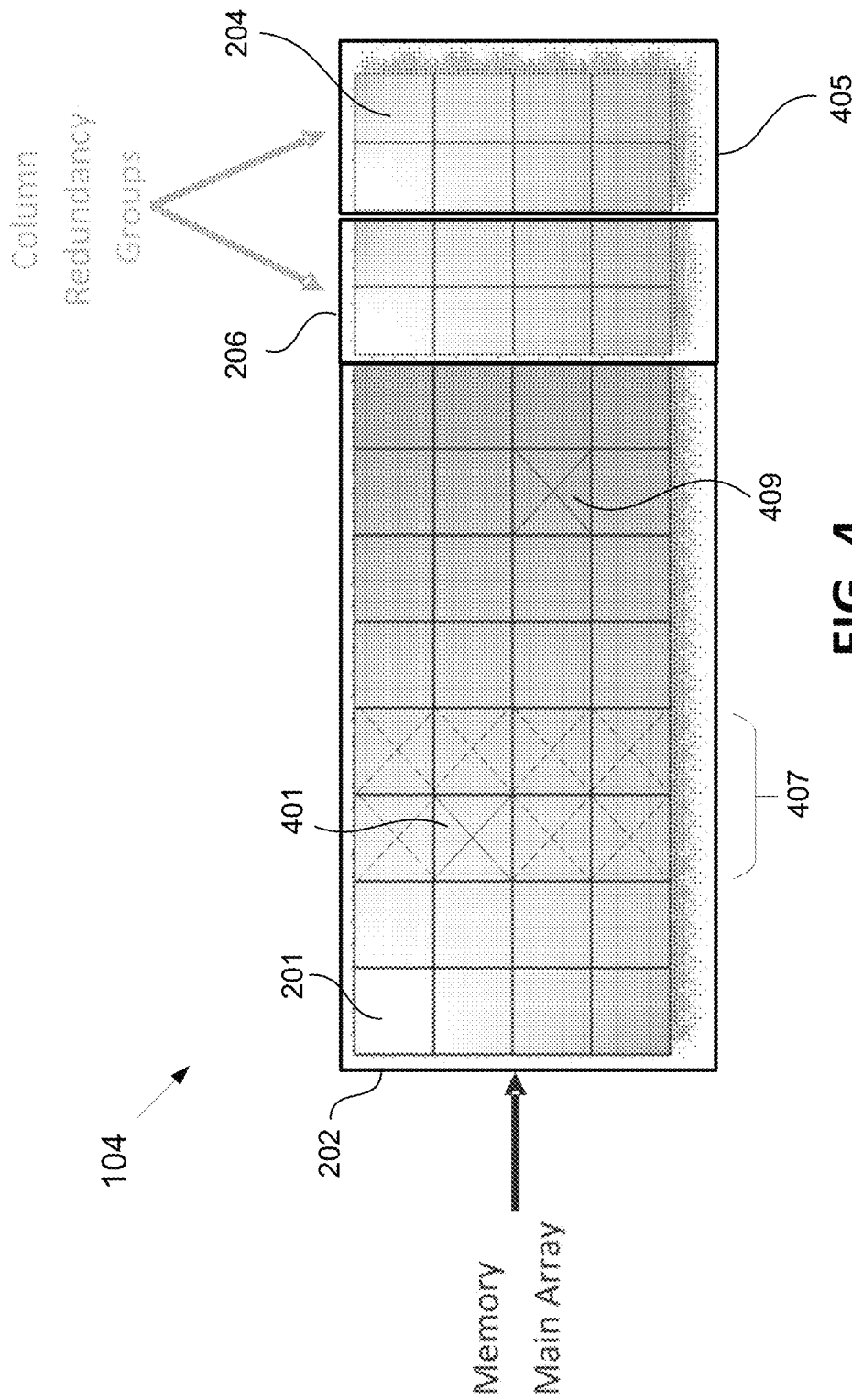
FIG. 4 is an illustration of a memory main array with a failed memory element in the second row of the third column within the memory main array.

The usage rate calculator 510 determines a redundancy usage rate based on information provided by the memory parameter source 508 and the memory defect density source 514. In some embodiments, the memory parameter source 508 provides information regarding memory main arrays 604 comprising memory elements 201 within the SoC 600, such as the number of words stored in each memory main array 604, number of bits per word within the memory main array 604, number of redundant elements within the memory main array 604, etc. The memory defect density source 514 provides information based on data provided by the foundry in which the memories 604 of the SoC 600 will be fabricated or historical data regarding the number of failures that have occurred in memories made under similar conditions. In accordance with some embodiments of the disclosed method and apparatus, one or more of the memories 604 within modules 601, 602 of the SoC 600 are organized as shown in FIG. 2, FIG. 3 or FIG. 4 and discussed above.

This information is used to determine the likelihood that any particular memory element 201 will be defective. The usage rate calculator 510 uses a first formula to calculate a memory redundancy usage rate from the information provided by the two sources 508, 514. The RSMA sizer 512 uses a second formula to calculate an optimal size and number of RSMAs 606 to be fabricated within one or more modules 601 of the SoC 600 based on the redundancy usage rate calculated by the usage rate calculator 510. The output from the RSMA sizer 512 is then used to design an SoC architecture 501. More particularly, the output of the probability engine 502 is provided as input to an SoC design architecture 501. The SoC design architecture 501 uses the input from the probability engine 502 to determine the size of optimal RSMAs 606 for a particular SoC design associated with the information provided to the probability engine 502. Further details regarding the operation of the probability engine 502 are provided below.

The module 601 comprises a server 603. The server 603 comprises a repair engine 607. In some embodiments, the server is coupled to each of a plurality of Built-In-Self-Test units (BISTs) 605 within one or more modules 602 of the SoC 600. The BISTs 605 each are coupled to one or more associated memories 604. The server 603 communicates with the BISTs 605 to coordinate self-tests of the associated memories 604. If faults are detected by the BISTs 605, the location of the faults is communicated to the server 603 and stored in an appropriate RSMA 606. The repair engine 607 can then access the information from the RSMAs 606 and make repairs to the memory 604 by making substitutions of redundant memory groups for those memory elements indicated by the RSMA 606 to be faulty. In some alternative embodiments, the repair engine 607 can be directly coupled to the memory main arrays 604 within each of the modules 602. In such a case, the server coordinates and controls the operation of testing the memory main arrays for faults and substituting redundancy groups for failed memory elements 401 in the memory main arrays 604.

Figure 7:
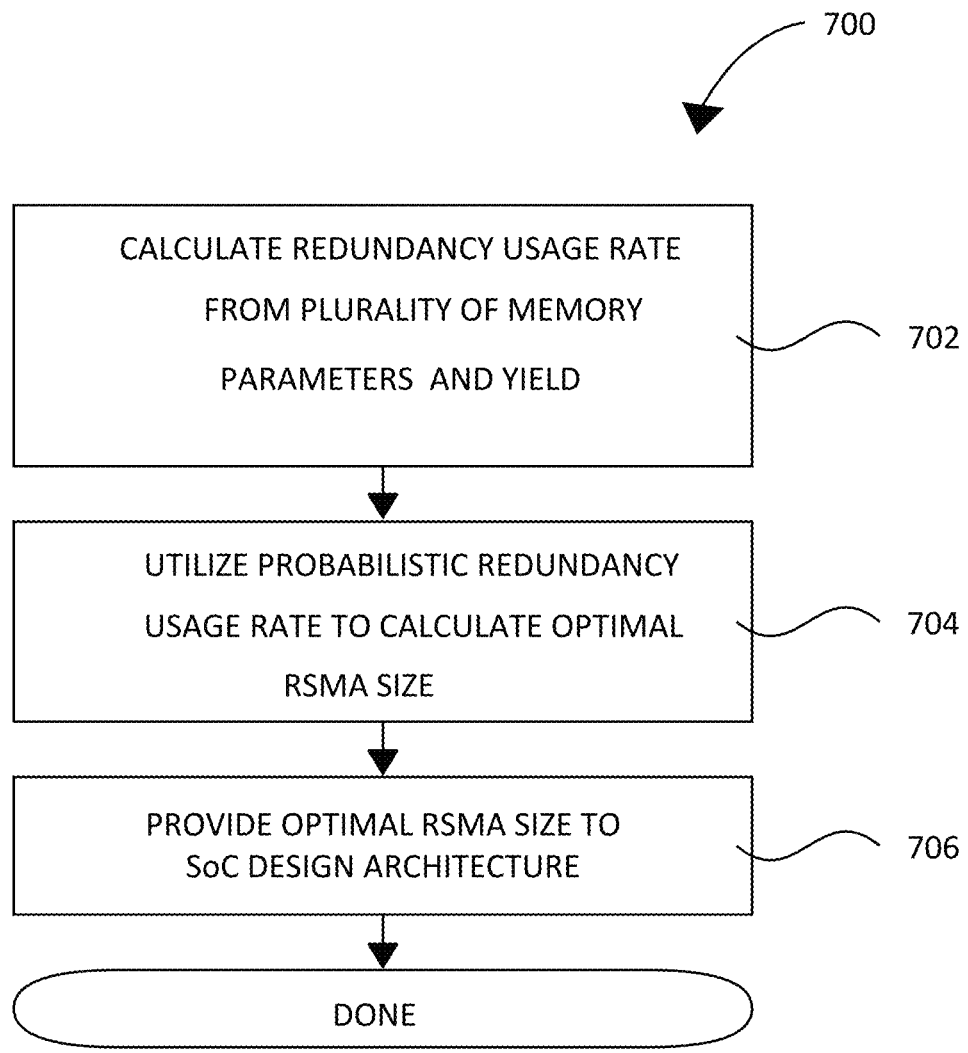
FIG. 7 is a memory repair process in accordance with one embodiment of the disclosed method and apparatus.

FIG. 7 is a flowchart illustrating a memory repair process 700. Initially, a redundancy usage rate is calculated from a plurality of memory parameters and from memory yield (block 702). The memory repair process 700 uses the probabilistic redundancy usage rate to calculate an optimal RSMA size (block 704). The SoC design architecture 501 is provided with an optimal RSMA size (block 706).

The first formula, which is used to calculate a memory redundancy usage rate from the information provided by the two sources, is:

$$u = \sum_{q=1}^{n} \left( \binom{n}{q} y^{(n-q)}(1-y)^q \sum_{k=1}^{\min(c,\lfloor n/l \rfloor,q)} \right. $$

EQ. 1

-continued $$\left. k \frac{\binom{n-kl+k}{k}\binom{k(l-1)}{q-k} + \sum_{i=1}^{l-1}\binom{n-(k-1)l+k-1-i}{k-1}\binom{k(l-1)-l+i}{q-k}}{\binom{n}{q}} \right)$$

The formula is based on expected value of a random variable, wherein:

n is the number of columns in memory (as stored in memory parameters source 508);

c is the number of redundancy groups in memory (as stored in memory parameters source 508);

l is the number of elements per redundancy group (as stored in memory parameters source 508); and y is the memory yield of one column in memory (as stored in memory defect density source 514).

The value of y can be calculated either by the memory defect density source 514 or by an external device and stored within the memory defect density source 514. The value can be determined using well-known formulas based on memory die area and memory defect density ($d_0$), e. g. according to Poisson model:

$$y = \sqrt[n]{e^{-ad_0}}$$

EQ. 2 wherein n is the number of columns in memory and e is the base of the natural log.

The second formula, which is used by the probability engine 502 to calculate an optimal size for the RSMA 606 used with a group of M memories, is:

$$efus\_size = \Sigma_{i=1}^{M} u_i * F$$

EQ. 3 wherein:

efuse_size is the number of bits required for the RSMA;

M is the number of memories in the group;

$u_i$ is the redundancy usage rate of i-th memory; and

F is the number of RSMA bits needed for one redundancy, calculation of F is simple and straightforward, as well as it depends on implementation.

Example 1

TABLE 1

| Project # | Memory defect density (1/cm²) | Redundancy Usage Rate (%) |
|---|---|---|
| Project 1 | 0.055 | 0.15363% |
| Project 2 | 0.0279 | 0.078% |
| Project 3 | 0.0171 | 0.048% |

Table 1 shows the result of calculations performed to determine the memory redundancy usage rate for SoC designs for three different projects. If another project was implemented at a later time, for which only 10 out of 20,000 memory instances required repair (i.e., redundancy usage rate of 0.05%), the RSMA would have approximately the same order of magnitude as project 3 based on the above disclosed formulas.

Example 2

For a fifth project in which the RSMA 606 is fabricated as 32 bit×32 bit sections of non-volatile memory, and in which the SoC design includes 5 modules, the chip area savings using an optimal RSMA size based on the above proposed formulas can be calculated as follows:

If 100% redundancy usage rate is assumed, the number of RSMA bits is calculated to be 4519; then, 5 sections of non-volatile memory of 32 bits×32 bits (1024 bits) would be needed to fabricate an RSMA large enough to store the necessary information. This would require a chip total area of 4200422.649 um² if using 16 nm technology node.

Alternatively, by implementing the disclosed method to determine an optimal RSMA size, the number of bits that the RSMA needs to be able to store can be reduced to less than 71 RSMA bits, taking into account the memory yield for the memory at issue. Therefore, only one 32×32 (1024 bits) section of non-volatile memory is needed to implement an RSMA that can support the calculated usage rate. If smaller sections of non-volatile memory are used to fabricate the RSMA, such as sections of 16 bits×8 bits (128 bits), then the required 71 bits would fit within an even smaller area. Accordingly, the chip total area can be reduced to 4007924.697 um², even with non-volatile memory sections of 32 bits×32 bits; resulting in a saving of approximately 4.58% in area. Using smaller sections of non-volatile memory to fabricate the RSMA 606 can reduce the chip total area, making the saving even greater than 4.58%.

Figure 8:
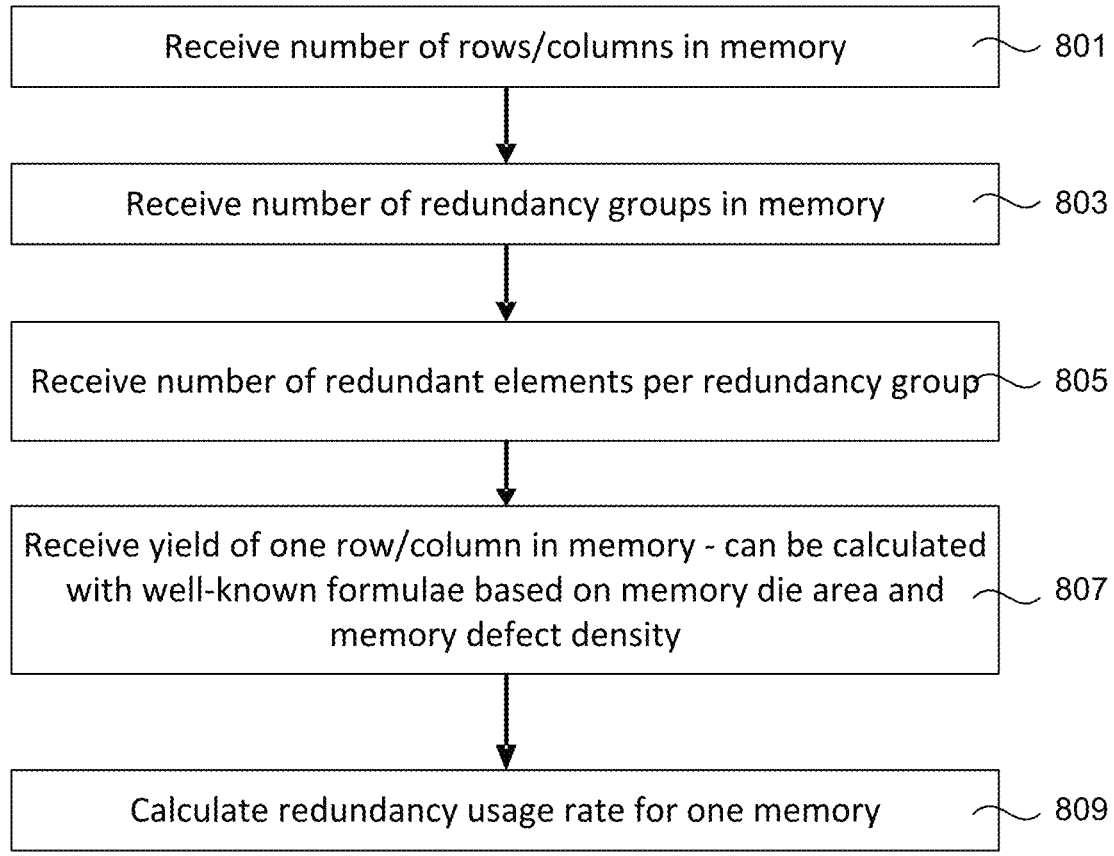
FIG. 8 is a flowchart for using Formula 1 to calculate a redundancy usage rate for one memory (either for row or column redundant elements) based on an expected value of a random variable in accordance with one embodiment of the disclosed method and apparatus.

FIG. 8 is a flowchart for using Formula 1 to calculate a redundancy usage rate for one memory (using either for row or column redundant elements). The usage rate calculator 510 receives the number of memory rows (when memory has row redundant elements) or memory columns (when memory has column redundant elements) (block 801). In addition, the usage rate calculator 510 receives the number of redundancy groups in memory (block 803). The usage rate calculator 510 also receives the number of redundant elements per redundancy group (block 805) and the memory yield of one memory row (when memory has row redundant elements) or one memory column (when memory has column redundant elements) (block 807). The usage rate calculator 510 then uses these received values to calculate the redundancy usage rate for one memory (block 809).

Figure 9:
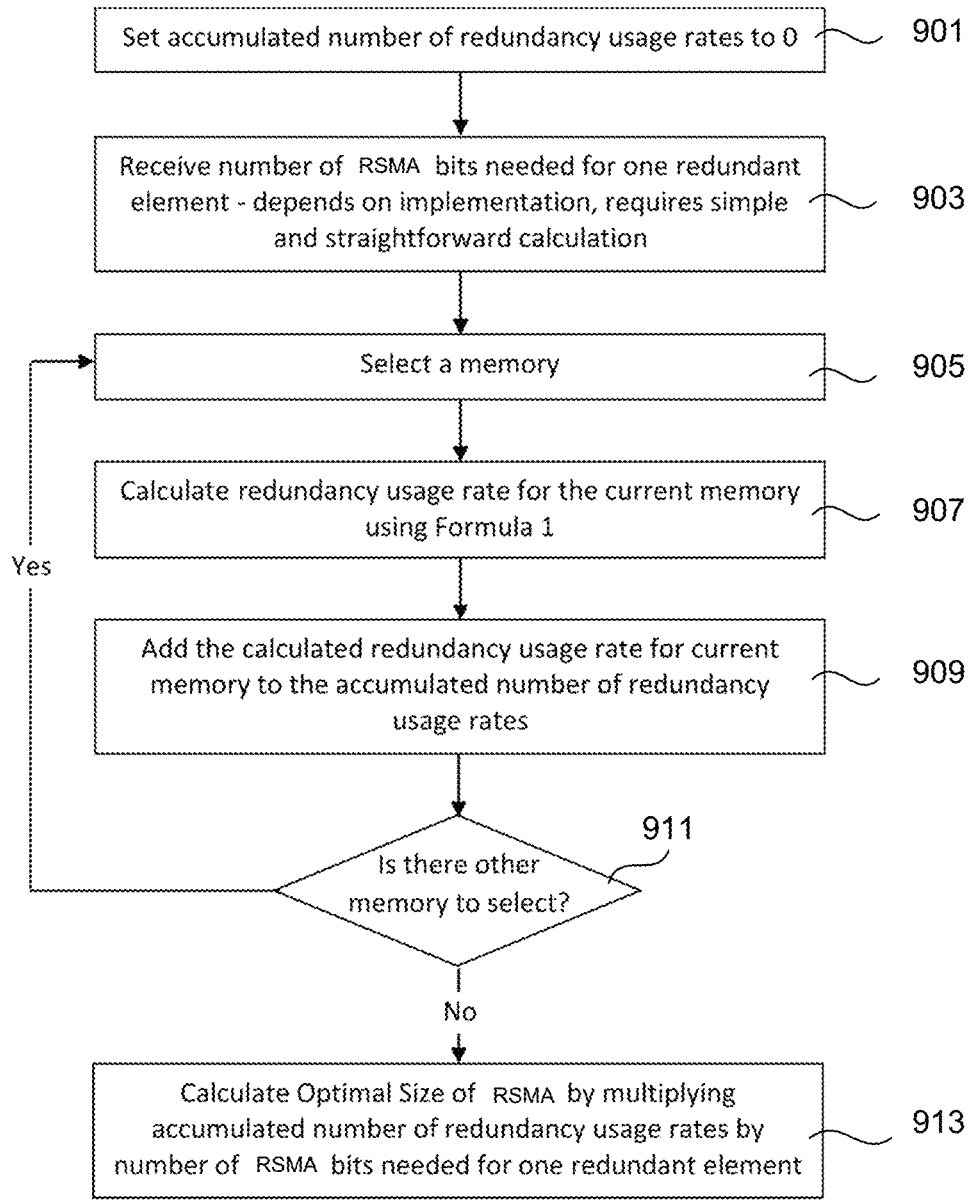
FIG. 9 is a flowchart for using Formula 2 to calculate an optimal RSMA size in accordance with one embodiment of the disclosed method and apparatus.

FIG. 9 is a flowchart illustrating the use of Formula 2 to calculate an optimal RSMA size. Initially, a variable for holding an accumulated redundancy usage rate (referred to herein as "ARUR") is set to zero (block 901). Next, the number of RSMA bits needed for one redundant element is received from the memory parameters source 508 (block 903). Alternatively, the source of the number of RSMA bits could something other than the memory parameters source 508. Next, calculations regarding the first memory 604 is selected (block 905). The redundancy usage rate is calculated for this first memory using the first formula (as illustrated in FIG. 8) (block 907). In one embodiment, the number of RSMA bits required for such a calculated usage rate is determined (i.e., the usage rate is multiplied by the number of bits required for one repair) and stored in the ARUR variable (block 909). Alternatively, the usage rate itself is stored in the ARUR. Either way, a determination is made as to whether the usage rate has been determined for all of the memories 604 (block 911). If not, then the usage rate for the next memory 604 is determined in block 907. Blocks 905 through 911 are repeated until usage rates have been accumulated in the ARUR for all of the memory blocks in the SoC 600, at which time the value of the ARUR is either equal to the total number of bits required in the RSMA or the total usage rate for all of the memories 604, which can then be multiplied by the number of bits for one repair (block 913).

What is claimed is:

1. A method for making a system on a chip (SoC) having a repair signature memory area (RSMA), the method comprising:
   calculating a redundancy usage rate from plurality of memory parameters and a memory yield;
   using the redundancy usage rate to calculate an optimal RSMA size; and
   configuring an RSMA within the SoC with the optimal RSMA size;
wherein the memory parameters include at least one of the following: number of columns; number of redundancy groups; and the number of elements per redundancy group and wherein using the redundancy usage rate includes using the following formula:

$$e\text{fuse\_size} = \Sigma_{i=1}^{M} u_i * F$$

to calculate the optimal RSMA size, wherein efuse_size is the optimal RSMA size;
   M is the number of memories in a redundancy group;
   $u_i$ is a redundancy usage rate calculated for an i-th memory within the redundancy group;
   F is the number of RSMA bits needed to repair one defect within a memory main array within the SoC.

2. A method for making a system on a chip (SoC) having a repair signature memory area (RSMA), the method comprising:
   calculating a redundancy usage rate from plurality of memory parameters and a memory yield;
   using the redundancy usage rate to calculate an optimal RSMA size; and
   configuring an RSMA within the SoC with the optimal RSMA size;
wherein the memory parameters include at least one of the following: number of columns; number of redundancy groups; and the number of elements per redundancy group and wherein the memory yield is determined from the following equation:

$$y = \sqrt[n]{e^{-\alpha d_0}}.$$

3. A method for making a system on a chip (SoC) having a repair signature memory area (RSMA), the method comprising:
   calculating a redundancy usage rate from plurality of memory parameters and a memory yield;
   using the redundancy usage rate to calculate an optimal RSMA size; and
   configuring an RSMA within the SoC with the optimal RSMA size;
wherein the memory parameters include at least one of the following: number of columns; number of redundancy groups; and the number of elements per redundancy group and wherein the redundancy usage rate is calculated according to the following Equation:

$$u = \sum_{q=1}^{n} \left\{ \binom{n}{q} y^{(n-q)}(1-y)^q \right.$$

$$\left. \sum_{k=1}^{min(c,[\frac{n}{l}],q)} \left( k \frac{\binom{n-kl+k}{k}\binom{k(l-1)}{q-k} + \sum_{i=1}^{l-1} \binom{n-(k-1)l+k-1-i}{k-1}\binom{k(l-1)-l+i}{q-k}}{\binom{n}{q}} \right) \right\}$$

wherein:

n is the number of columns in memory as stored in memory parameters source;

c is the number of redundancy groups in memory as stored in memory parameters source;

I is the number of elements per redundancy group as stored in memory parameters source; and y is the memory yield of one column in memory as stored in memory defect density source.

4. The method of claim 3, wherein the y is determined from the following equation:

$$y = \sqrt[n]{e^{-ad_0}}$$

wherein n is the number of columns in a memory main array; and e is the base of the natural log.

* * * * *